United States Patent
Brooks

[11] Patent Number: 6,155,027
[45] Date of Patent: Dec. 5, 2000

[54] METHOD AND APPARATUS FOR PACKAGING CONTAMINANT-SENSITIVE ARTICLES AND RESULTING PACKAGE

[76] Inventor: Ray G. Brooks, 2436 Aberdeen, Bedford, Tex. 76021

[21] Appl. No.: 09/452,549

[22] Filed: Dec. 1, 1999

Related U.S. Application Data

[62] Division of application No. 08/645,559, May 13, 1996, Pat. No. 6,003,674.

[51] Int. Cl.$^7$ .................................................. B65B 31/00
[52] U.S. Cl. ................................. 53/434; 53/432; 53/449
[58] Field of Search .......................... 53/170, 173, 449, 53/432, 434, 510, 512; 206/832, 524.8, 711, 712

[56] References Cited

U.S. PATENT DOCUMENTS

| | | | |
|---|---|---|---|
| 2,316,607 | 4/1943 | MacDonald | 53/432 |
| 3,438,397 | 4/1969 | Gilpin | 137/317 |
| 3,797,317 | 3/1974 | Peterson, Jr. | 137/317 |
| 3,930,413 | 1/1976 | Laird et al. | 137/317 |
| 4,091,919 | 5/1978 | MacLeod et al. | 206/454 |
| 4,171,740 | 10/1979 | Clement et al. | 206/454 |
| 4,721,207 | 1/1988 | Kikuchi | 206/454 |
| 4,754,595 | 7/1988 | Sanderson | 53/434 |
| 4,886,152 | 12/1989 | Ambrogio | 206/710 |
| 4,919,955 | 4/1990 | Mitchell | 426/394 |
| 4,966,284 | 10/1990 | Gregerson et al. | 206/711 |
| 5,211,717 | 5/1993 | Skoura | 206/710 |
| 5,248,033 | 9/1993 | Kos et al. | 206/454 |
| 5,255,783 | 10/1993 | Goodman et al. | 206/711 |
| 5,255,797 | 10/1993 | Kos | 206/454 |
| 5,274,914 | 1/1994 | Kitamura et al. | 53/449 |
| 5,398,481 | 3/1995 | Takeuchi et al. | 53/432 |
| 5,472,086 | 12/1995 | Holliday et al. | 206/454 |
| 5,476,176 | 12/1995 | Gregerson et al. | 206/454 |
| 5,724,748 | 3/1998 | Brooks et al. | 34/90 |
| 5,818,059 | 10/1998 | Coyne | 53/512 |

Primary Examiner—Linda Johnson
Attorney, Agent, or Firm—Geoffrey A. Mantooth

[57] ABSTRACT

A method, apparatus and package for packaging contaminant-sensitive articles such as semiconductor wafers on shock absorbers in a sealed rigid plastic enclosure such as a box or the like which may be enclosed within another sealed enclosure wherein the sealed enclosures are each provided with a self-sealing member together with a hollow needle connected to a source of purging gas and a vacuum source for selectively piecing one or more of the self-sealing members to communicate the gas and vacuum sources with a selected one of the enclosures interiors for purging and/or evacuating the enclosures interiors to remove ion contaminants, moisture, oxygen, plastic particles, etc. whereby corrosive activity on the articles is eliminated and the sealed condition of both enclosures is maintained after the contaminants, etc. are removed and the needle is withdrawn thereby providing increased productive yields of such articles being processed between manufacturing steps by reducing or substantially eliminating environmental variations.

5 Claims, 5 Drawing Sheets

6,155,027

METHOD AND APPARATUS FOR PACKAGING CONTAMINANT-SENSITIVE ARTICLES AND RESULTING PACKAGE

This application is a divisional application of Ser. No. 08/645,559, filed May 13, 1996 now U.S. Pat. No. 6,003,674.

FIELD OF THE INVENTION

This invention relates to the elimination of the contamination of contaminant-sensitive articles stored in sealed plastic containers and more particularly to a method, apparatus and package for removing such contaminants as moisture, oxygen, ion contaminates and the like from the container interior and maintaining the interior contaminant-free for an indefinite period of time so as to increase productive yields between manufacturing steps by eliminating environmental variations.

DESCRIPTION OF THE PRIOR ART

Rapidly developing technology in the manufacturing of contaminant-sensitive articles such as semiconductor wafers has placed ever higher requirements on the elimination of contaminants. The ever increasing sensitivity of such wafers has made the presence of even infinitesimal amounts of contaminants a drawback to quality production and the elimination of rejects.

Myriad sources of such contaminants are always present. One such source is the plastic particles or shavings formed when the sharp edges of the wafers scrape or rub against the plastic wafer supports. Another source is ion contaminants from containers formed of polymeric material such as plastic bags, boxes and the like. Such ion contaminants migrate to wafer surfaces and can cause circuit degradation due to caustic and/or corrosive elements such as CL, PO4, NO3, Na and K found in polymeric material. Such polymeric material tends to "outgas" so that these elements become mobile with environmental moisture and are attracted to the surface of the wafers. It is therefore highly desirable to package such articles in sealed plastic enclosures devoid of contaminant activity to the greatest extent possible.

One form of protection has been the use of a dessicant prepackaged in a vapor transmission type material which is placed within the plastic enclosure prior to sealing. This dessicant or "getter" acts to absorb the atmospheric contaminants such as moisture and oxygen during packaging and storage. Such dessicants generally include Silica Gel and molecular sieves used for absorbing moisture and ferrous shavings such as iron bits for absorbing oxygen. For further enhancing the removal of such contaminants, the enclosure interior is frequently purged with an inert gas and evacuated prior to sealing.

In spite of all such prior art efforts, it has been found that undesirable contamination of the packaged sensitive articles still occurs to some extent for two reasons. First, present-day sealing apparatus depends on a negative pressure for the sealing operation. Consequently, the lack of a positive shut-off arrangement allows atmospheric contaminants to remain in the enclosure after sealing. In addition, all polymeric material from which such bags and boxes are constructed have some Water Vapor Transmission Rate(WVTR) causing penetration of moisture and other contaminants through the enclosure wall which dessicants are intended to remove.

Although removal of such contaminants is generally effective, the shelf-life of all packaged dessicants is limited and when such shelf-life is exceeded, further contaminant elimination is non-existent unless resort is had to the time consuming and expensive practice of repackaging and replacement. Furthermore, when such dessicants are used for packaging articles, improper handling of dessicants by n personnel including storage prior to use, can reduce the efficacy of such dessicants.

Another contamination problem is presented even if the wafers are packaged at the production site in a contaminant-free environment. It has been proven that contamination levels over prolonged periods of time vary due to such factors as the materials used, ambient storage conditions such as pressure, temperature, vibration, moisture concentration as well as package sealing techniques.

Such contamination levels are not consistent and since it would be impractical cost-wise to measure contamination on a semi-continuous or continuous basis, the ultimate user must deal with such inconsistencies or variations adding to manufacturing costs. Such increased costs at the point of use arise from the need for cleaning the wafers which may or may not eliminate the contaminants or the wafers. Thus, what might be referred to as "Wafer Environment Control" (WEC) becomes a vital consideration. Such variations are "money" to the user since they impact on subsequent processes and possibly the yields of the final product or semiconductor that is being produced on the wafer.

There is the additional problem of particles which may be either free agents or particles produced by the sharp edges of packaged wafers rubbing against the plastic surfaces on which the wafers are supported in the package such as shock absorbers or the like. Such particles are another factor concerning WEC due to variables from lot to lot.

In summary, myriad sources of contamination are present for contaminant-sensitive articles packaged in enclosures of polymeric material which include the continuous production of ion contaminants by polymeric material whose mobility is primarily dependent on moisture. In addition, penetration of water vapor through the polymeric material into the enclosure interior, improper handling and sealing of the enclosure and the limitation of the effectiveness of dessicants over the long term when extended storage periods are encountered.

SUMMARY OF THE INVENTION

Accordingly, a primary object of the invention is to provide a new and novel method and package for packaging contaminant-sensitive articles such as semiconductor wafers in a contaminant-free environment.

Another object of the invention is to provide a new and novel method and package for maintaining packaged contaminant-sensitive articles in a contaminant-free environment for prolonged periods of time.

A further object of the invention is to provide a new and novel sealed package for contaminant-sensitive articles such as semiconductor wafers which permits periodic removal of contaminants from the package interior which may occur during extended storage, transport, etc. while maintaining the package in a sealed condition.

Still another object of the invention is to provide a new and novel apparatus for automatically purging and evacuating a package of semiconductor wafers while maintaining the wafers in a sealed packaged condition.

A still further object of the invention is to provide a new and novel method of removing contaminants from a sealed package of contaminant-sensitive articles at selected intervals to consistently maintain the articles in a contaminant-free environment.

A further object of the invention is to provide increased productive yields of packaged contaminant-sensitive articles such as semiconductor wafers being processed between manufacturing steps by reducing or substantially eliminating environmental variations within the package.

Another object of the invention is to provide a new and novel enclosure for contaminant-sensitive articles which is readily adaptable for multi-enclosure packaging while maintaining all of the enclosures' interior in a contaminant-free environment.

Still another object of the invention is to provide a new and novel package for contaminant-sensitive articles such as semiconductor wafers which is simple and inexpensive in construction, which provides a completely sealed construction and which is capable of maintaining such articles in an absolutely clean environment for an indefinite period of time.

A still further object of the invention is to provide a new and novel method and apparatus for removing atmospheric free agent particles or plastic particles produced by the abrasion of wafer supports by the packaged wafers.

The objects of the invention and other related objects are accomplished by the provision of an enclosure formed of rigid plastic material adapted for packaging in a sealed condition one or more contaminant-sensitive articles such as semiconductor wafers on a shock-absorbing structure, the enclosure having an opening on which is mounted a self-sealing member of rubber or the like by suitable means such as a clamp, adhesive, etc. After sealing, the enclosure interior is conditioned and maintained contaminant-free with the use of a hollow instrument such as a needle connected to both a source of purging gas and a vacuum source through a controller for penetrating the rubber member while maintaining the enclosure in a sealed condition thereby permitting the enclosure interior to be either purged or evacuated or both for selected periods and cycles whereby the rubber member reseals when the needle is withdrawn. The enclosure may also be enclosed in a flexible bag of relatively impervious plastic material to which a similar self-sealing member is is adhered whereby with the use of the needle, the interiors of both the bag and enclosure remains contaminant-free indefinitely thereby permitting the articles at the time of use to be consistently free of contaminants.

DESCRIPTION OF THE PREFERRED EMBODIMENTS

Figure 1:
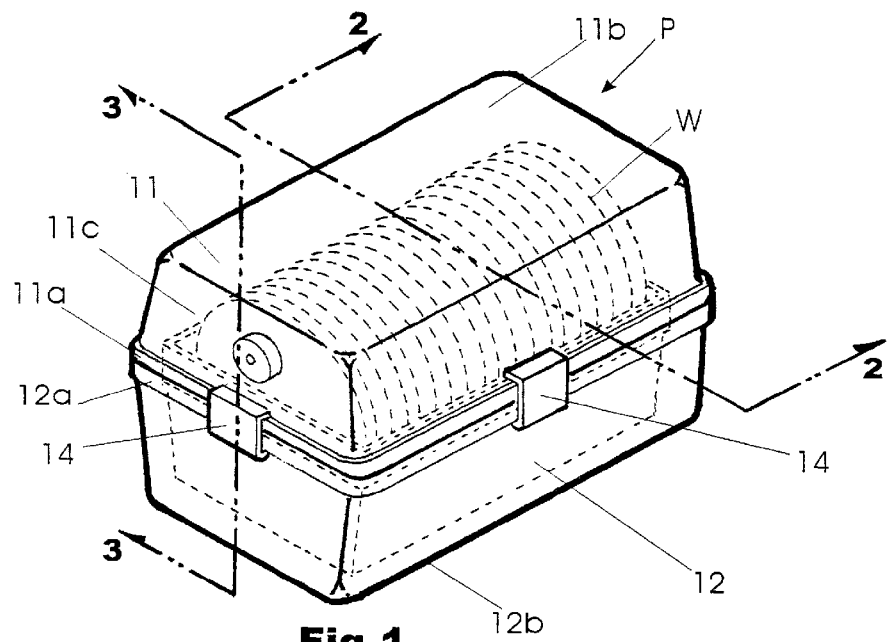
FIG. 1 is a perspective view of an enclosure for contaminant-sensitive articles constructed in accordance with the invention.

Referring now to the drawings and to FIG. 1 in particular, there is shown a package constructed in accordance with the invention and designated generally by the letter P. The package or enclosure P is of the type in which are stored contaminant-sensitive articles such as semiconductor wafers on shock-absorbing support means as shown in FIG. 2 and as will be explained hereinafter.

More specifically, the enclosure P is formed of rigid synthetic resinous material such as polypropylene and includes a top section 11 and a bottom section 12 adapted for interfitting sealing engagement. The enclosure sections 11, 12 are provided with peripheral edges 11a, 12a and top and bottom walls 11b, 12b respectively with the edges 11a, 12a arranged for overlapping engagement as shown in FIGS. 2, 3. One of such edges such as edge 12a is provided with a gasket 13 for sealing. Preferably, a plurality of pivotally mounted, spaced-apart, hinge-type latches 14 are provided on one of the sections 11, 12. In the illustrated embodiment, the latches 14 are formed integrally with the top section 11 for engagement with the edge 12a of the bottom section 12. Preferably, one of such latches 14 is provided on each side and on each end of the top section 11 of the enclosure P.

The latches 14 are arranged for pivotal movement from the broken line position to the solid line position of FIG. 3 into latching engagement with the edge 12a of the bottom section 12 to maintain the interior 16 of the enclosure P in a completely sealed condition.

Figure 2:
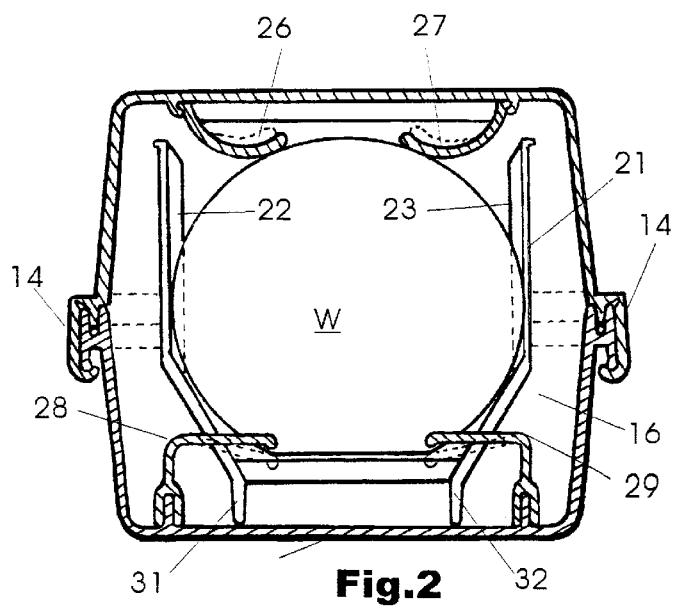
FIG. 2 is a sectional view taken substantially along line 2—2 of FIG. 1 in the direction of the arrows.
Figure 3:
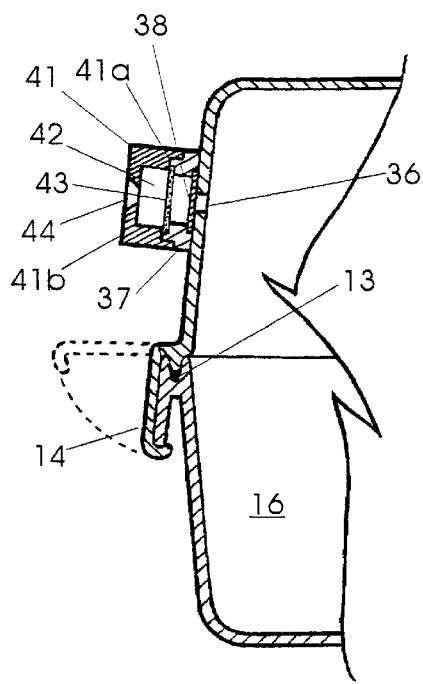
FIG. 3 is a sectional view taken substantially along line 3—3 of FIG. 1 in the direction of the arrows.

As shown best in FIG. 2, shock-absorbing support means for a plurality of wafers W are provided with the enclosure interior 16. More specifically, the wafers W are supported in a boat or cassette of well-known construction designated generally by the reference numeral 21. The cassette 21 includes oppositely disposed, spaced-apart partitions 22, 23 for isolating each wafer. Spaced-apart, yieldable shock absorbers 26, 27 disposed on the top wall 11b of the top section 11 urge the wafers downwardly into yieldably supported engagement with shock absorbers 28, 29 disposed on the bottom wall 12b of the bottom section 12. Note that preferably the cassette 21 is provided with spaced-apart bottom extensions 31, 32 which engage the bottom section wall 12b.

As can be understood, the shock absorbers 26–29 yielding support the wafers W so as to absorb impact type energy such as when the enclosure P is dropped. Rubbing of the sharp-edged wafers against the support parts which could dislodge contaminating particles is thereby minimized.

Means are provided for purging and evacuating the enclosure interior 16 while maintaining the enclosure P in a sealed condition. More specifically, the enclosure P is provided with an opening 36 preferably in the end wall 11c of the top section 11. A sleeve 37 is disposed on the enclosure end wall 11c in coaxial relationship with the opening 36 and preferably formed integrally with the enclosure P. The sleeve 37 is adapted to retain a particle type entrapment microfilter 38 in overlying relationship with the opening 36.

An end cap 41 having a central bore 42 is mounted in press-fitted engagement with the sleeve 37 as shown in FIG. 3. The end cap 41 includes a portion 41a of enlarged inside diameter which accommodates both the sleeve 37 and a self-sealing member or patch 43 of a rubber-like material clamped between the cap 41 and the open end of the sleeve 37. The cap 41 also includes an outer end wall 41b provided with a central opening 44 preferably tapered as shown. Thus, with the open end of the sleeve 37 sealed by the patch 43, enclosure P is maintained in a completely sealed condition.

As has been pointed out, the environment within the enclosure P does not remain clean or contaminant-free with the passage of time due to the penetration of moisture, production of ion contaminants by the plastic material, plastic particles produced by wafer abrasion on the wafer supports, etc. with the attendant deleterious effect on the stored wafers. Therefore, associated apparatus is provided for purging and/or evacuation of the enclosure interior 16 of such contaminants while the enclosure is in a sealed contion. More specifically, as shown best in FIGS. 4, 9, the apparatus includes an elongated wand 46 having a central bore 47 for accommodating the rear end portion of a hollow instrument such as a needle 48 connected to a hose 49 supported in the central bore 47 by means of a bushing 51.

Figure 4:
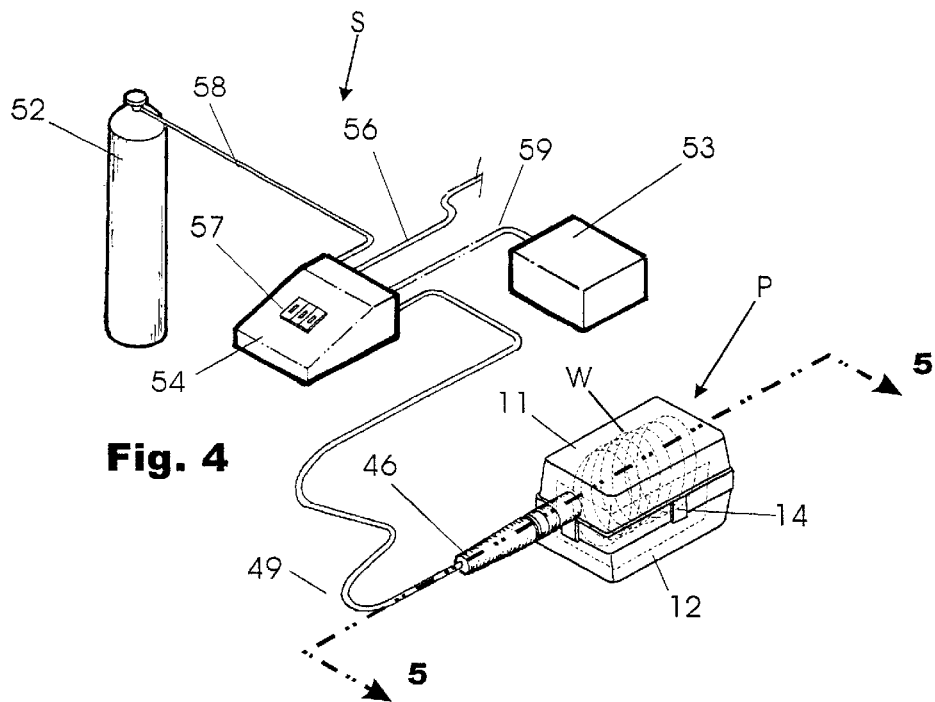
FIG. 4 is a perspective view of the enclosure of FIG. 1 together with an associated fluid pumping apparatus.

The needle 48 is connected by means of hose 49 to a system S which includes a source 52 of a purging gas such as nitrogen and a vacuum source 53 as shown in FIG. 4.

Although a manually operated system for the gas and vacuum sources 52, 53 may be utilized, an automatic system is preferably provided as shown in FIG. 4. In the system S of FIG. 4, the hose 49 is connected to a controller 54 connected to a source of electric power by means of conductors 56. The controller 54 is provided with a timer control 57 of a conventional type for setting the durations of the purging and evacuation cycles. The controller 54 is connected by means of hoses 58, 59 to the source of purging gas 52 and vacuum source 53 respectively.

Figure 9:
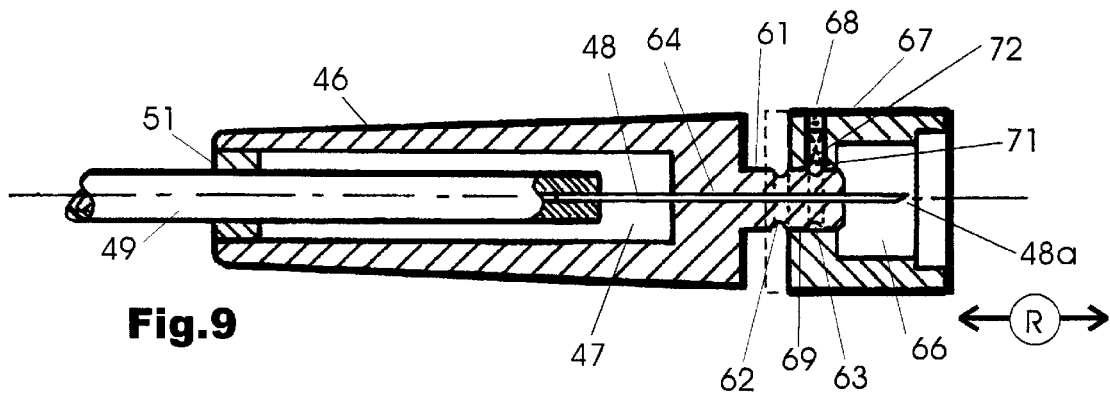
FIG. 9 is a sectional view of a portion of the associated fluid pumping apparatus of FIG. 8.

Referring now to FIG. 9, the wand 46 includes a necked-down, forwardly extending portion 61 having a pair of axially spaced, annular grooves 62, 63. The needle 48 is provided with a pointed forward end 48a and extends through a central bore 64 in portion 61 with the pointed end 48a disposed within a central bore 66 of an adapter 67 supported on the wand portion 61. As can be seen, detent means 68 are provided within a radial bore 69 of the adapter 67. The detent means 68 preferably comprises a ball 71 and spring 72 with the ball 71 yieldingly urged into one of the grooves 62, 63. Therefore, the adapter 67 may be moved axially and selectively positioned in either the broken line or solid line positions as indicated by the double arrow R and with the ball 71 seated in the appropriate groove 62, 63.

Figure 5:
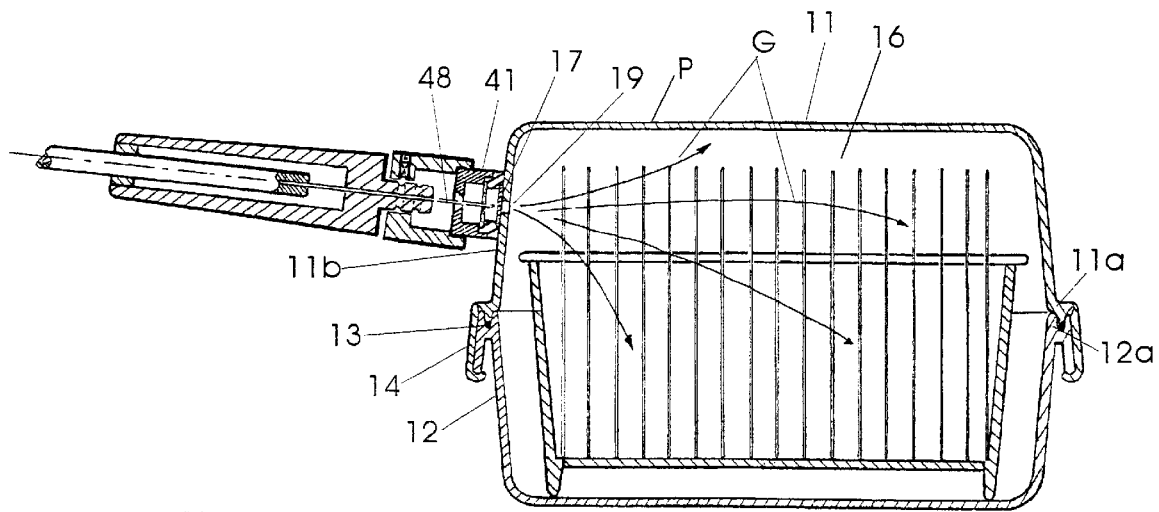
FIG. 5 is an enlarged sectional view taken substantially along line 5—5 of FIG. 4 in the direction of the arrows.

When there is a need for removing ion and particle contaminants from the enclosure interior 16 or even shortly after the wafers are packaged, the wand 46 is manually grasped by the operator and the adapter, in the axial position of FIG. 9, is placed over the cap 41 as shown best in FIG. 5. In this position, the needle 48 extends through the opening 44 in cap 41 and penetrates patch 43 so that the pointed end of the needle communicates with the enclosure interior through the particle type entrapment microfilter 38 and enclosure wall opening 36. Thus, the purging gas is introduced into the enclosure interior 16 for a period of time as determined by the controller 54, the gas flow being indicated by the arrows G in FIG. 5.

Following the purging cycle, the evacuation cycle is initiated by the controller 54 to evacuate the enclosure interior 16 and to remove any remaining purging gas or contaminants.

Following the purging and evacuation cycles, the needle 48 can now be withdrawn and as a result of the self-sealing characteristics of the rubber patch 43, the patch immediately reseals maintaining the enclosure P is the sealed condition. Subsequently, when it is later determined that further treatment of the environment within the enclosure is necessary, the purging and evacuation cycles are repeated with the enclosure P remaining in the sealed condition.

Figure 6:
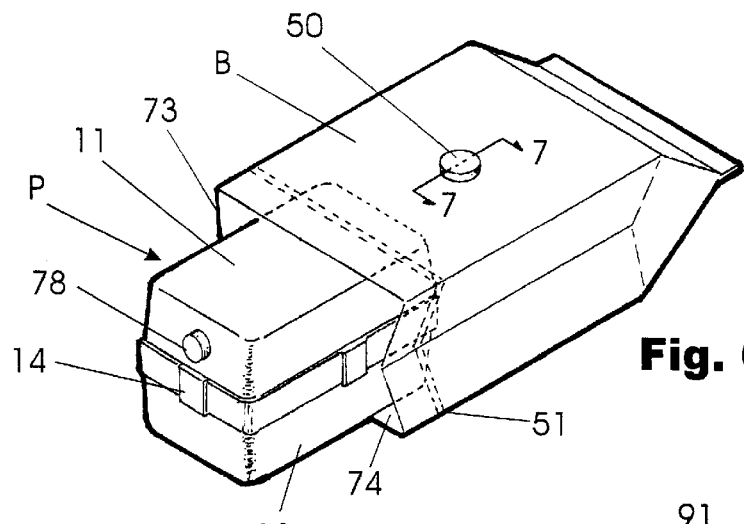
FIG. 6 is a perspective view of another embodiment of the invention in an intermediate assembly step.

Referring now to FIG. 6, there is shown another embodiment of the invention wherein like numerals are used to indicate like parts. In the embodiment of FIG. 6, the enclosure P in which wafers are packaged as described above is enclosed in another enclosure such as a bag designated generally by the letter B. The bag B is preferably formed of synthetic resinous material or plastic such as polyethylene and may be of a laminated construct on having laminates of both polyethylene and nylon.

A laminated construction for the bag B using different types of plastic material further inhibits the vapor transmission rates of various contaminants. For instance, polyethylene has a high resistance to the transmission of moisture but a low resistance to the transmission of oxygen. On the other hand, nylon has a high resistance to the transmission of oxygen and a low resistance to the transmission of moisture. A laminated bag B of polyethylene and nylon would therefore produce a superior barrier for oxygen and moisture.

Figure 8:
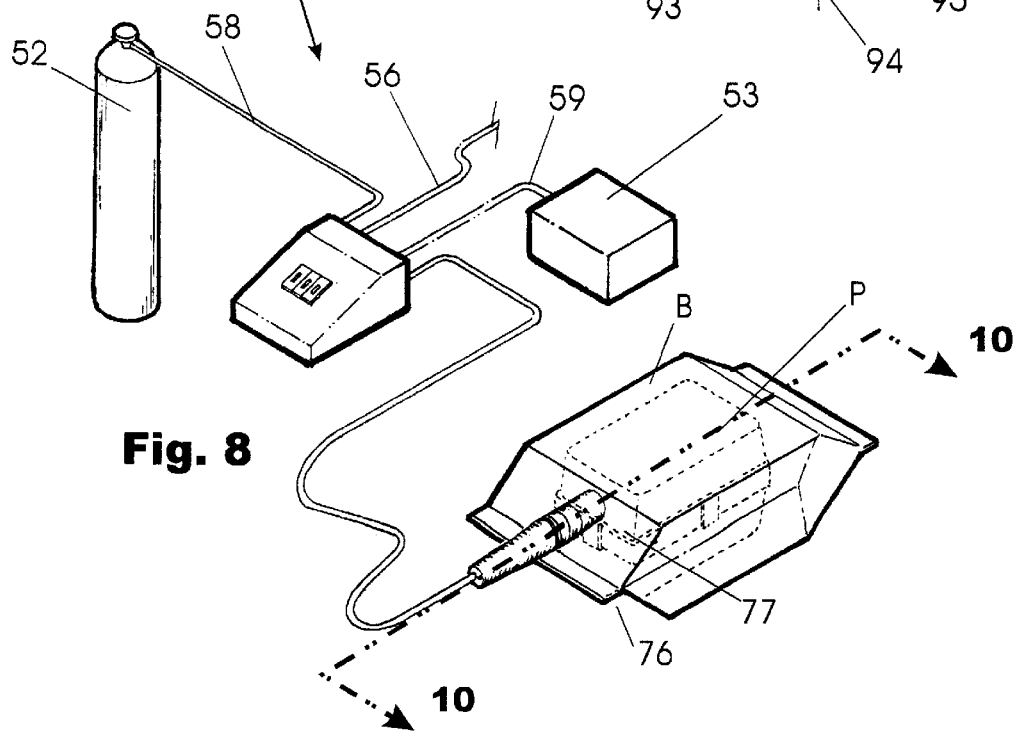
FIG. 8 is a diagrammatic view of the embodiment of FIG. 6 together with associated fluid pumping apparatus.

As shown in FIG. 6, the bag B is provided with an open end 73 and an interior 74 for accommodating the enclosure P. The bag B is subsequently sealed by heat sealing or the like with the enclosure P therein to form a seal 76 as shown in FIG. 8.

Means are provided for purging and evacuating the interior 74 of the bag B and therefore provide added protection against contamination of the articles in enclosure P. More specifically, as shown in FIG. 8, an end wall 77 of the bag B is provided with a fitting designated generally by the reference numeral 78. As shown best in FIG. 7, the fitting 78 is positioned within an opening 79 in the bag wall 77 and in the sealed condition of the bag B, the fitting 78 is positioned closely adjacent the end cap 41 on the enclosure P.

Figure 7:
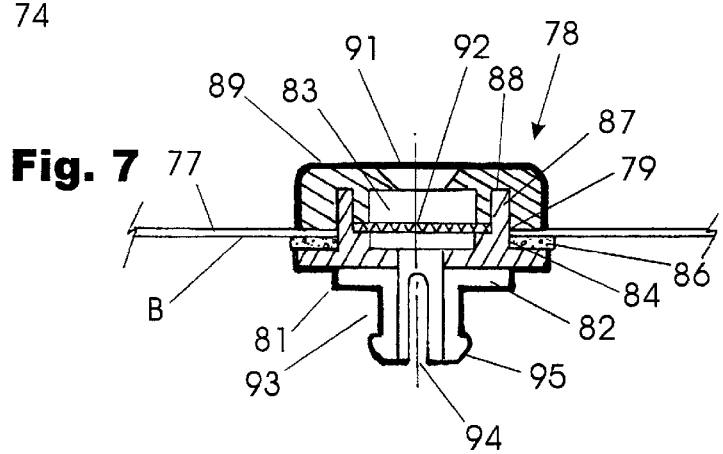
FIG. 7 is an enlarged sectional view taken substantially a long line 7—7 of FIG. 6 in the direction of the arrows.

Referring now to FIG. 7, the fitting 78 includes a nipple 81 having a body portion 82 defining a central bore 83. The nipple body portion 82 includes a peripheral flange 84 for supporting a gasket 86. The nipple 81 extends through the bag opening 79 with the upper end having an enlarged inner diameter to define an annular end portion 87. The end portion 87 is adapted to be accommodated within an annular groove 88 in the underside of an end cap 89 having a central opening 91 preferably tapered as shown. A self-sealing member or patch 92 such as the patch 43 of FIG. 3 is clamped between the cap 89 and the nipple 81 so as to maintain the bag B in the sealed condition.

The underside of the nipple 81 is provided with a necked-down portion 93 provided with circumferentially-spaced slots 94 so as to provide spring fingers 95. As shown best in FIG. 10, the necked-down portion 93 is accommodated within the central opening 44 in the cap 41 on the enclosure P and yieldingly retained therein by the spring fingers 95.

Figure 10:
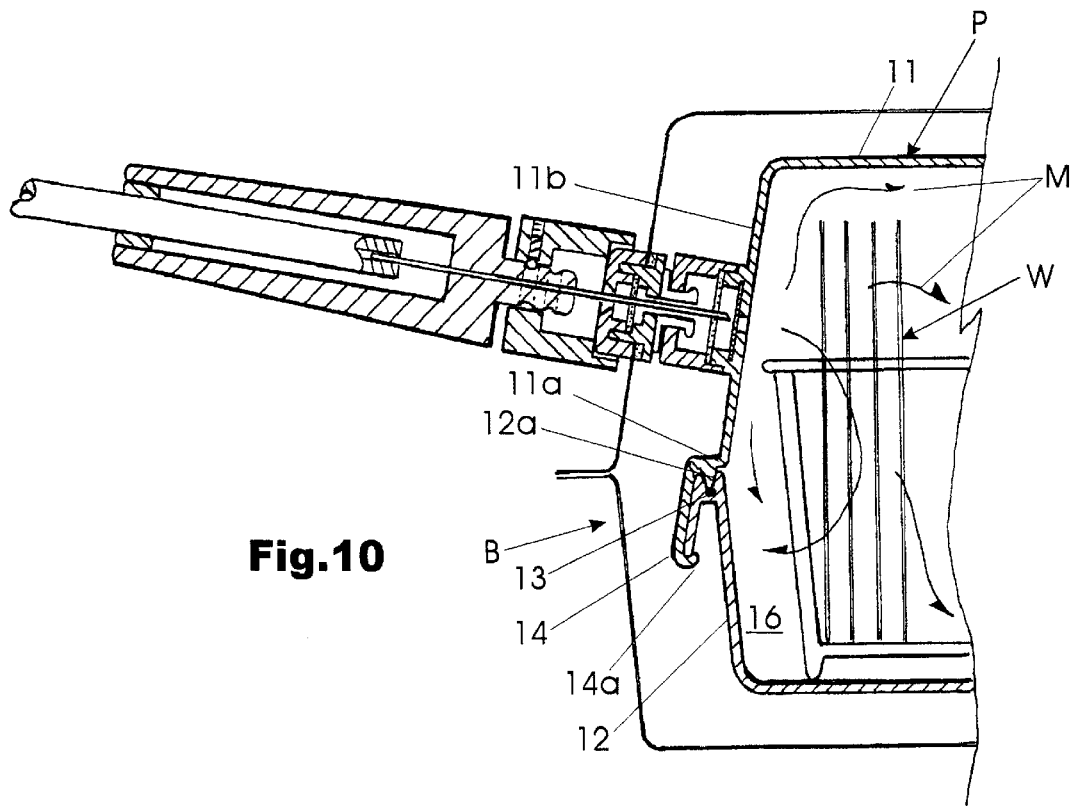
FIG. 10 is an enlarged sectional view taken substantially along line 10—10 of FIG. 8 in the direction of the direction of the arrows showing the parts in one stage of the novel method of the invention.
Figure 11:
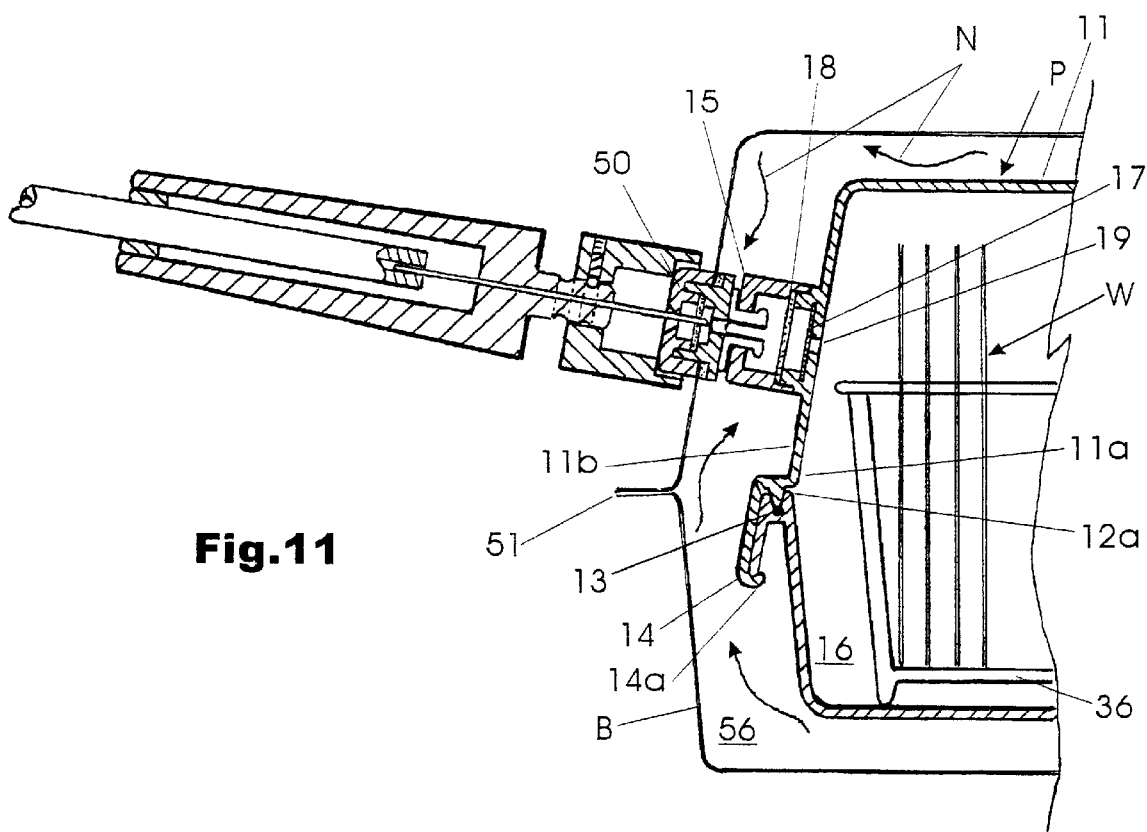
FIG. 11 is a sectional view similar to FIG. 10 showing the parts in another stage of the novel method of the invention.

In the embodiment of FIGS. 10, 11 and with the ball 71 on the wand detent means 68 in engagement with groove 62 as shown in FIG. 10, the needle 48 is inserted centrally through the fitting 78 on the bag B and the patches 92, 43 on the bag B and enclosure P respectively so that the needle end 48a lies in communication with the interior 16 of the sealed enclosure P. At this time, purging and/or evacuation of the enclosure interior 16 may be accomplished as described above and as indicated by the arrows M while maintaining both the bag B and enclosure P in the sealed condition. Withdrawal of the needle 48 permits the patches 43, 92 to reseal with the bag and enclosure remaining in the sealed condition.

If it is desired to purge and/or evacuate the interior 74 of the bag B and thereby provide additional contaminant protection for the wafers W in the enclosure P, the adapter 67 is moved axially into the position of FIG. 11 wherein the ball 71 on the detent means 68 engages groove 63 on the wand necked-down portion 61. The wand adapter 67 is then engaged with the end cap 89 on the bag fitting 78 with the needle penetrating patch 92 and the needle tip 48a disposed in the nipple central bore 83. Communication is thus established from the needle tip 48a and the bag interior 74 through the slots 94 between the nipple spring fingers 95. At this time, both the bag B and enclosure P remain in the sealed condition and the purging and/or evacuation steps may be carried out as heretofore described and as indicated by the arrows N. As can be understood, withdrawal of the needle 48 from the bag fitting 78 permits the resealing of of the patch 92.

It should be understood that even further protection against wafer contamination can be obtained by the use of an additional bag B in which the bag and enclosure of FIGS. 10, 11 are inserted. This additional bag would be provided with a fitting 78 in which the necked-down portion 93 is inserted within the fitting end cap opening 91 in snap-fitting engagement therewith.

What is claimed is:

1. A method of packaging semiconductor wafers, comprising the steps of:
    a) providing a rigid first enclosure having an interior compartment therein, the enclosure having a wall with an opening therethrough, the opening being closed by a first self-sealing member;
    b) locating the wafers in the interior compartment of the first enclosure;
    c) closing and sealing the first enclosure;
    d) providing a second enclosure having an interior compartment, the second enclosure having a wall with an opening therein, the second enclosure opening being closed by a second self-sealing member;
    e) after closing and sealing the first enclosure, locating the first enclosure in the second enclosure interior compartment;
    f) aligning the first self-sealing member with the second self-sealing member;
    g) closing and sealing the second enclosure;
    h) penetrating the second and first self-sealing members with a tubular instrument;
    i) introducing purging gas into the interior compartment of the first enclosure through the tubular instrument;
    j) withdrawing the tubular instrument from the first and second self-sealing members.

2. The method of claim 1 wherein the step of closing the first enclosure further comprises the step of latching the first enclosure closed.

3. The method of claim 1 further comprising the step of, after introducing purging gas into the interior compartment of the first enclosure, evacuating the gas from the interior compartment of the first enclosure.

4. The method of claim 1, further comprising the steps of:
    a) after introducing purging gas into the interior compartment of the first enclosure, withdrawing the tubular instrument from the first self-sealing member, while continuing to penetrate the second self-sealing member;
    b) introducing purging gas into the second enclosure interior compartment through the tubular instrument;
    c) withdrawing the tubular instrument from the second self-sealing member.

5. The method of claim 1, wherein the step of introducing purging gas into the interior department of the first enclosure through the tubular instrument further comprises the step of introducing the purging gas through a filter.

* * * * *